US010901851B2

(12) United States Patent
Batcheller et al.

(10) Patent No.: US 10,901,851 B2
(45) Date of Patent: Jan. 26, 2021

(54) DELAY CIRCUITRY TO HOLD UP POWER TO A MASS STORAGE DEVICE AND METHOD THEREFOR

(71) Applicant: Sanmina Corporation, San Jose, CA (US)

(72) Inventors: Paul Batcheller, San Jose, CA (US); Matthew Bowman, San Jose, CA (US); Drew G. Doblar, San Jose, CA (US); Franz Michael Schuette, Colorado Springs, CO (US)

(73) Assignee: Sanmina Corporation, San Jose, CA (US)

( * ) Notice: Subject to any disclaimer, the term of this patent is extended or adjusted under 35 U.S.C. 154(b) by 263 days.

(21) Appl. No.: 15/971,712

(22) Filed: May 4, 2018

(65) Prior Publication Data

US 2018/0322011 A1    Nov. 8, 2018

Related U.S. Application Data

(60) Provisional application No. 62/501,665, filed on May 4, 2017.

(51) Int. Cl.
| | | |
|---|---|---|
| *G06F 11/00* | (2006.01) | |
| *G06F 11/14* | (2006.01) | |
| *H05K 1/02* | (2006.01) | |
| *H03K 5/00* | (2006.01) | |
| *H02H 7/20* | (2006.01) | |
| *G06F 1/30* | (2006.01) | |
| *G06F 11/20* | (2006.01) | |
| *G11C 16/22* | (2006.01) | |
| *G11C 5/14* | (2006.01) | |

(52) U.S. Cl.
CPC ............ *G06F 11/1415* (2013.01); *G06F 1/30* (2013.01); *G06F 11/2015* (2013.01); *H02H 7/20* (2013.01); *H03K 5/00* (2013.01); *H05K 1/0293* (2013.01); *G06F 2201/86* (2013.01); *G11C 5/141* (2013.01); *G11C 16/22* (2013.01); *H03K 2005/00078* (2013.01); *H03K 2005/00195* (2013.01); *H05K 2201/10159* (2013.01); *H05K 2201/10181* (2013.01)

(58) Field of Classification Search
CPC .... G06F 11/1415; G06F 11/1446; G06F 1/30; H03K 2005/00013; H03K 2005/0015; H03K 2005/00195; H03K 2005/00078; H02H 7/20; H02K 1/0293; H02K 2201/10181; H02K 2201/10159; G11C 5/141; G11C 16/22
See application file for complete search history.

(56) References Cited

U.S. PATENT DOCUMENTS

| | | | |
|---|---|---|---|
| 2018/0032390 A1* | 2/2018 | Rahmanian | G06F 11/0754 |
| 2018/0113822 A1* | 4/2018 | Pronozuk | G06F 13/4068 |
| 2019/0073331 A1* | 3/2019 | Long | G06F 1/263 |

* cited by examiner

*Primary Examiner* — Marc Duncan
(74) *Attorney, Agent, or Firm* — Heidi Eisenhut; Loza & Loza, LLP

(57) ABSTRACT

A delay circuitry is configured to hold up power to a mass storage device after a power fault disables communication of the mass storage device with the host computer. The time delay is sufficient to allow saving of in-flight data from the storage device's volatile cache to the non-volatile media (of the storage device) and to update a metadata table in the non-volatile media.

16 Claims, 6 Drawing Sheets

DELAY CIRCUITRY TO HOLD UP POWER TO A MASS STORAGE DEVICE AND METHOD THEREFOR

CLAIM OF PRIORITY

The present application for patent claims priority to U.S. Provisional Application No. 62/501,665 entitled DELAY CIRCUITRY TO HOLD UP POWER TO A MASS STORAGE DEVICE AND METHOD THEREOF, filed May 4, 2017 and which is hereby expressly incorporated by reference herein.

FIELD

The various features of the present disclosure relate to memory devices for use with computers and other processing apparatuses. More particularly, one aspect of the present disclosure relates to solid state drives and using Serial Advanced Technology Attachment (SATA), Serial Attached SCSI (SAS), or Non-Volatile Memory Express (NVMe) as an interface with a host computer and volatile memory for cache and metadata.

BACKGROUND OF THE INVENTION

Solid state drives have become the storage media of choice as the first tier of storage in high performance computing. The prevalent technology used in the non-volatile memory mass storage devices is negative-AND (NAND) flash since it offers reasonably low latency access, write endurance and data retention at the currently lowest cost per bit compared to other solid state memories. NAND flash memory is organized in blocks and pages, wherein blocks are the smallest unit for any erase of data and pages (or sub-pages) are the smallest unit for writing or reading. In addition, NAND flash has some unique characteristics, in particular the fact that data, once committed to the NAND flash memory cells, cannot be overwritten without inserting an erase cycle for the entire block. This necessitates operation of NAND flash-based storage devices strictly in append mode.

The append mode, in combination with the block-level erase mechanism, requires constant moving and coalescing of data in order to free up blocks that are partially filled up with invalid data. Consequently, the metadata table, which translates logical block addresses into physical block and page addresses of the flash memory integrated circuits, needs to be constantly updated. Updating of the metadata table in NAND flash is very time consuming and inefficient since every single write access to the drive would require rewriting of the metadata entries. Most drives, also referred to as non-volatile memory mass storage devices, therefore, load the metadata into a volatile cache memory typically using dynamic random-access memory (DRAM) technology and only periodically write back the changed entries to the non-volatile NAND flash memory data carriers. This type of operation leaves the NAND flash drives vulnerable in the event of power failure since in-flight data residing in the cache and more importantly, the latest iteration of the metadata table may be lost. Consequently, recently updated files may not be found or even worse, the entire file structure may be corrupted.

In high end servers, individual components are protected from surges and over-current situations by resettable or self-resetting circuit breakers commonly referred to as e-fuses. A common design uses two separate power paths, the first to supply power to a control logic that can be used to select the drive by a host computer, power On/Off or reset the drive and the second to supply power to the drive itself. Both power paths are protected by independent e-fuses, which, however, are typically coupled so that if the control logic power faults, the drive power is automatically cut as well. This design has the disadvantage of potentially increasing power-loss events and by extension the risk of data loss or drive corruption.

Consequently, there is a need for a better solution that provides some hold-up power to the drive in the event that the control logic (including data path) experiences a power fault to allow for of all data held in volatile memory following loss of communication between the drive and the host computer to be committed to the non-volatile data carriers.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, a computer device is provided. The computer device comprises an enclosure having one or more host computers powered by a power supply; a plurality of non-volatile memory mass storage devices having a volatile memory cache and a non-volatile memory data carrier; a plurality of interposer boards, the one or more host computers communicatively coupled to the plurality of non-volatile memory mass storage devices by the plurality of interposer boards; where at least one of the host computers in the one or more host devices is configured to exchange data and control signals with selected non-volatile memory devices in the plurality of non-volatile memory mass storage devices. Each of the interposer boards in the plurality of interposer boards comprises a first e-fuse to gate power to a logic circuit on the at least one interposer board along a data path to a first non-volatile memory mass storage device in the plurality of non-volatile memory mass storage devices; a second e-fuse to gate power to the first non-volatile memory mass storage device in the plurality of non-volatile memory mass storage devices, wherein the first and the second e-fuses are logically connected to fault the second e-fuse when a fault condition occurs on the first e-fuse; and a delay circuit, coupled between the first e-fuse and the second e-fuse, configured to delay the fault of the second e-fuse after the fault of the first e-fuse.

According to one aspect, the computer device further comprises a midplane coupled between the one or more host devices and the plurality of interposer boards.

According to another aspect, the fault of the second e-fuse causes power to be turned Off to the first non-volatile memory mass storage device after a time delay caused by the delay circuit, the time delay relative to the fault of the first e-fuse.

According to yet another aspect, the time delay provides sufficient time for data to be copied from the volatile cache memory in the first non-volatile memory mass storage device to the non-volatile memory data carrier.

According to yet another aspect, the computer device further comprises a multiplexing control logic circuit on the interposer boards, the multiplexing logic configured to select a non-volatile mass storage device in the plurality of non-volatile memory devices by the one or more host computers, where a power converter powers the multiplexing control logic circuit.

According to yet another aspect, the delay circuit comprises an array of capacitors having one or more capacitors; a supply voltage adapted to charge the one or more capacitors in the array of capacitors; a first metal-oxide-semiconductor field-effect transistor (MOSFET) connected to the array of capacitors, wherein when in a non-fault condition, the first MOSFET is in a low-resistance state to connect the supply voltage to the one or more capacitors in the array of capacitors to a ground; and when a fault condition from the power converter powering the multiplexing logic circuit and connected to a gate of the first MOSFET switches the first MOSFET to a high resistance state to ground, the high resistance state of the first MOSFET preventing the supply voltage to the array of capacitors from draining to ground and causing charging of the array of capacitors; and a second MOSFET coupled to the array of capacitors, wherein when a charge of the one or more capacitors in the array of capacitors exceeds a gate threshold voltage of the second MOSFET, the second MOSFET switches from a high resistance state to a low resistance state, and the low resistance state of the second MOSFET causes the second e-fuse to turn Off power to the first non-volatile memory mass storage device.

According to yet another aspect, the computer device further comprises a first resistor coupled between the supply voltage and the array of capacitors for limiting an inrush current; and wherein a second resistor coupled between the array of capacitors and the first MOSFET for limiting a drain of the first MOSFET to ground. The second e-fuse includes a sense resistor for sensing an over current condition on the first non-volatile memory mass storage device.

According to yet another aspect, the non-volatile memory mass storage devices include non-volatile memory express (NVMe) devices and/or peripheral component interconnect express (PCIe) devices.

According to yet another aspect, the supply voltage is 12 volts.

According to yet another aspect, the power converter provides a voltage of 3.3 volts or 1.8 volts.

According to another feature, a method for power fail protection of a plurality of non-volatile memory devices in a computer device having an enclosure, a power supply unit, one or more host computers, a midplane and interposer boards to connect non-volatile memory mass storage devices with the one or more host computers is provided. The method includes configuring a host computer to exchange data and control signals with a selected non-volatile memory mass storage device in the plurality of non-volatile memory mass storage devices; providing power from a midplane supply voltage source to a multiplexing logic circuit along a data/signal path to the plurality of non-volatile memory mass storage device, and from the midplane supply voltage source to the plurality of non-volatile memory mass storage device; and automatically triggering a power shutoff, after a predictable time delay, of the plurality of non-volatile memory mass storage devices upon detecting a power fault condition along the data/signal path.

According to one aspect, the time delay is effectuated by delay circuit including an array of capacitors, the array of capacitors being charged by the midplane supply voltage source.

According to another aspect, the time delay provides sufficient time for data to be copied from a cache memory in the first non-volatile memory mass storage device to the non-volatile memory data carriers.

According to yet another feature, a circuit is provided. The circuit includes a non-volatile memory mass storage device having a volatile memory device and non-volatile data carrier, the volatile memory device configured to cache data prior to storing the data on non-volatile memory data carriers in the plurality of non-volatile memory mass storage devices; a power supply providing power, along a first power path, to a logic circuit along a data path to the storage device, and along a second power path to the storage device; a power fault detection circuit adapted to remove power from the second power path when a power fault is detected along the first power path; and a delay circuit configured to delay shutting off the non-volatile memory mass storage device after detection of the power fault along the first power path, the delay circuit providing time for the data to be copied from the volatile memory device to the non-volatile memory data carriers.

According to one aspect, wherein the delay circuit comprises: an array of capacitors having one or more capacitors; a supply voltage adapted to charge the one or more capacitors in the array of capacitors; a first metal-oxide-semiconductor field-effect transistor (MOSFET) connected to the array of capacitors, wherein when in a non-fault condition, the first MOSFET is in a low-resistance state to connect the supply voltage to the one or more capacitors in the array of capacitors to a ground; and when a fault condition from the power converter powering the multiplexing logic circuit and connected to a gate of the first MOSFET switches the first MOSFET to a high resistance state to ground, the high resistance state of the first MOSFET preventing the supply voltage to the array of capacitors from draining to the ground and causing charging of the array of capacitors; and a second MOSFET coupled to the array of capacitors, wherein when a charge of the one or more capacitors in the array of capacitors exceeds a gate threshold voltage of the second MOSFET, the second MOSFET switches from a high resistance state to a low resistance state, and the low resistance state of the second MOSFET causes the second e-fuse to turn Off power to the first non-volatile memory mass storage device.

According to another aspect, the circuit further comprises a first resistor coupled between the supply voltage and the array of capacitors for limiting an inrush current; and wherein a second resistor coupled between the array of capacitors and the first MOSFET for limiting a drain of the first MOSFET to the ground.

According to yet another feature, a computer device is provided. The computer device includes an enclosure having one or more host computers powered by a power supply; a plurality of non-volatile memory mass storage devices; a plurality of interposer boards, the one or more host computers communicatively coupled to the plurality of non-volatile memory mass storage devices by the plurality of interposer boards; a midplane coupled between the one or more host devices and the plurality of interposer boards; where at least one of the host computers in the one or more host devices configured to exchange data and control signals with selected non-volatile memory mass storage devices in the plurality of non-volatile memory mass storage devices.

Each of the interposer boards in the plurality of interposer boards may include a first e-fuse to gate power to a logic circuit on the at least one interposer board along a data path to a first non-volatile memory mass storage device in the plurality of non-volatile memory mass storage devices; a second e-fuse to gate power to the first non-volatile memory mass storage device in the plurality of non-volatile memory mass storage devices, wherein the first and the second e-fuses are logically connected to fault the second e-fuse when a fault condition occurs on the first e-fuse; and a delay circuit, coupled between the first e-fuse and the second e-fuse, configured to delay the fault of the second e-fuse after the fault of the first e-fuse.

According to one aspect, the delay circuit includes an array of capacitors having one or more capacitors; a midplane supply voltage source adapted to charge the one or more capacitors in the array of capacitors; a first metal-oxide-semiconductor field-effect transistor (MOSFET) connected to the array of capacitors, wherein in a non-fault condition, the first MOSFET is in a low-resistance state to connect the midplane supply voltage source to the one or more capacitors in the array of capacitors to a ground and wherein a fault condition from the power converter powering the multiplexing logic circuit and connected to a gate of the first MOSFET switches the first MOSFET to a high resistance state to ground, the high resistance state of the first MOSFET prevents the supply voltage to the array of capacitors from draining to the ground and causing charging of the array of capacitors; and a second MOSFET coupled to the array of capacitors, when a charge of the one or more capacitors in the array of capacitors exceeds a gate threshold voltage of the second MOSFET the second MOSFET switches from a high resistance state to a low resistance state, and the low resistance state of the second MOSFET causes the second e-fuse to turn Off power to the plurality of non-volatile memory mass storage device.

According to another aspect, the computer device further comprises a first resistor coupled between the midplane supply voltage and the array of capacitors for limiting an inrush current; and a second resistor coupled between the array of capacitors and the first MOSFET for limiting a drain of the first MOSFET to the ground.

According to yet another aspect, the second e-fuse includes a sense resistor for sensing an over current condition on the first non-volatile memory mass storage device.

BRIEF DESCRIPTION OF THE DRAWINGS

FIG. 3A illustrates an exemplary block diagram of an interposer board having a coupled dual power pathway to manage interposer board and drive power, according to an aspect of the present disclosure.

DETAILED DESCRIPTION

Figure 1A:
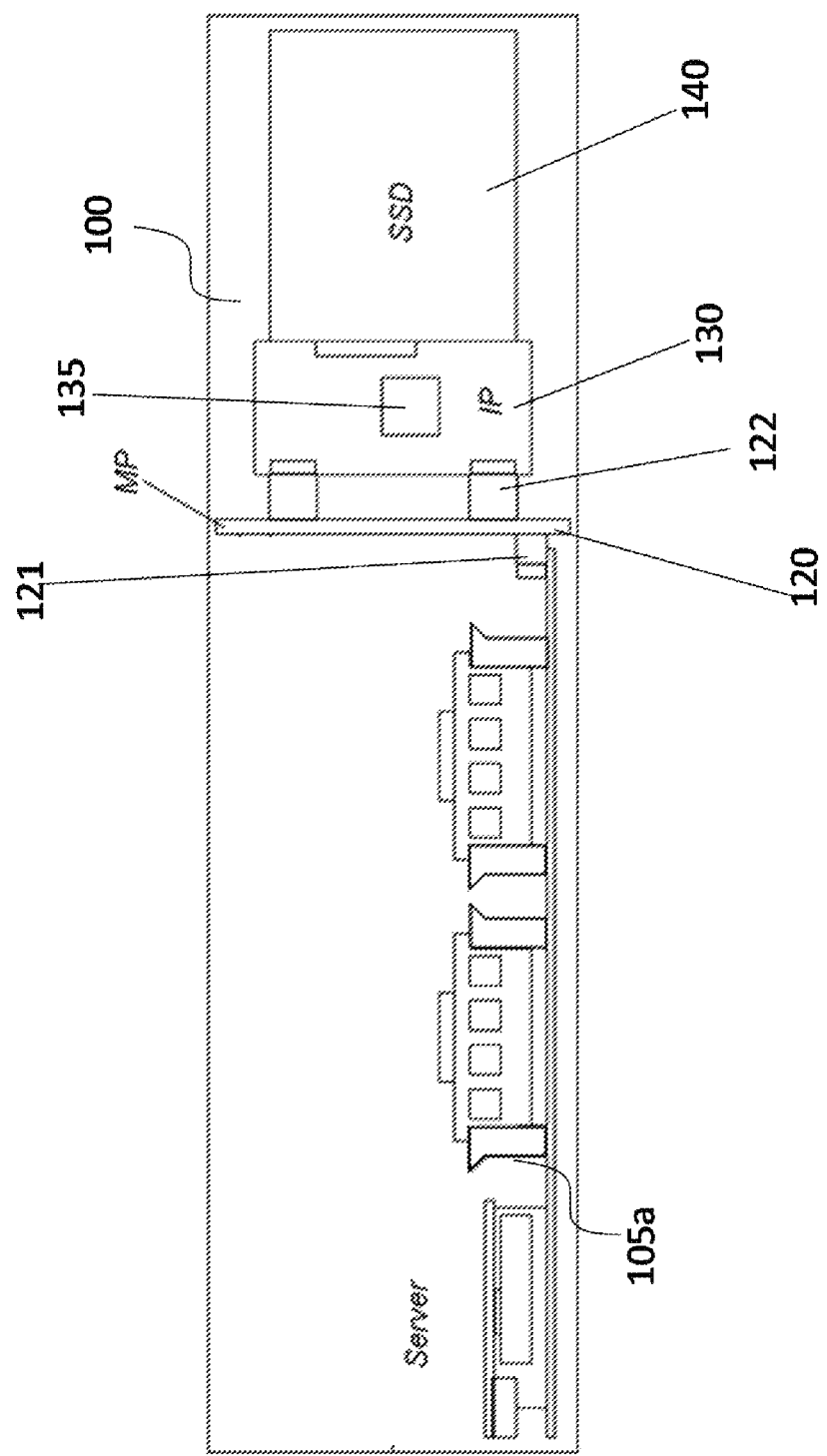
FIG. 1A illustrates a side view of a first exemplary computer system, according to an aspect of the present disclosure.

In the following detailed description, numerous specific details are set forth in order to provide a thorough understanding of the present disclosure. However, the present disclosure may be practiced without these specific details. In other instances, well known methods, procedures, structures, devices and/or components have not been described in detail so as not to unnecessarily obscure aspects of the present disclosure.

The term "exemplary" used throughout this description means "serving as an example, instance, or illustration," and should not necessarily be construed as preferred or advantageous over other exemplary embodiments. It will be apparent to those skilled in the art that the exemplary embodiments of the present disclosure may be practiced without these specific details. In some instances, well known structures and devices are shown in block diagram form in order to avoid obscuring the novelty of the exemplary embodiments presented herein.

In the following description, certain terminology is used to describe certain features of one or more embodiments. The terms "mass storage device" and/or "storage drive" may refer to a hard disk drive (HDD), a solid state drive in any form factor or any type of drive for storing data. The term "non-volatile mass storage device" or "drive" may refer to hard disk drives (HDD) or solid state drives (SSD) using protocols like SAS/SATA, NVMe or any other suitable data protocol. The "non-volatile mass storage devices" or "drives" may use rotating magnetic media, NAND flash, resistive random-access memory (ReRAM), magnetoresistive random access memory (MRAM), phase change memory (PCM), ferroelectric random access memory (FRAM) or any other suitable storage media known in the art. The term "delay" may refer to any delay in time between two events as well as to any circuitry that may generate the delay. The term "select" may refer to the selection of a drive by a server as well as any circuitry that may execute the select.

Overview

According to one aspect, power fail protection for non-volatile memory mass storage devices achieved in a computer system having an enclosure, a power supply unit, a host computer, a midplane and interposer boards to connect non-volatile memory mass storage devices with the host computer is provided. The host computer may be configurable to exchange data and control signals with select ones of the non-volatile memory mass storage devices, wherein the selection on the non-volatile memory mass storage device may be a function of a multiplexing control logic circuit on the interposer boards. The interposer boards have a first e-fuse to gate power to the logic circuit and a second e-fuse to gate power to the non-volatile mass storage device. The first and the second e-fuse may be logically connected so that a fault condition triggering a fault of the first e-fuse causes the second e-fuse to fault. A delay circuit may be utilized to delay the fault of the second e-fuse after the fault of the first e-fuse.

According to another aspect, power fail protection for non-volatile memory mass storage devices may be achieved in a computer system having an enclosure, a power supply unit, a plurality of host computers, interposer boards and an optional midplane to connect non-volatile memory mass storage devices with a host computer is provided. The host computer may be configured to exchange data and control signals with selected non-volatile memory mass storage devices, and the selection of the non-volatile memory mass storage device may be a function of a multiplexing control logic circuit on the interposer boards.

The interposer boards of the present disclosure may include a first e-fuse to gate power to the logic circuit, and a second e-fuse to gate power to the non-volatile mass storage device. The first e-fuse and the second e-fuse may be logically connected to fault/trip the second e-fuse if a fault condition occurs on the first e-fuse. However, a delay circuit may be utilized to delay the fault/tripping of the second e-fuse after the fault of the first e-fuse.

In a specific aspect, the delay circuit may comprise an array of capacitors that are charged by a supply voltage. The supply voltage (or midplane voltage) may be routed via a midplane and is typically 12 volts (V). The use of a midplane may be used as an example but any other structure, including cables or bus bars, for delivering power from the system power supply to the interposer is possible. The 12V midplane power traces may be connected to a first metal-oxide-semiconductor field-effect transistor (MOSFET), which is an N-gate and which, in a non-fault condition, is pulled high to a low-resistance state to connect the supply voltage to the capacitors to ground.

If a power fault condition occurs, the lack of output from a power converter powering the multiplexing control logic circuit, and connected to the gate of the first MOSFET, switches the first MOSFET to a high resistance state to ground. The high resistance state of the first MOSFET prevents the midplane voltage to the array of capacitors from draining to ground and causes a charge of the array of capacitors. Eventually, the charge of the capacitors exceeds a gate threshold voltage of a second MOSFET, causing the second MOSFET to switch from a high resistance state to a low resistance state. The low resistance state of the second MOSFET pulls the ENABLE/FAULT pin of the second e-fuse low to turn off power to the non-volatile memory mass storage devices.

A first resistor between the midplane voltage and the array of capacitors may be used to limit an inrush current and a second resistor between the array of capacitors and the first MOSFET may be used to limit the drain to ground. The second e-fuse may have a sense resistor to sense an over current condition on the non-volatile memory mass storage device. The midplane voltage is 12V, as described above, and the power converter generates 3.3V or 1.8V supply voltage to the interposer logic circuit.

Another aspect provides a method for power fail protection of non-volatile memory devices in a computer system having an enclosure, a power supply unit, a plurality of host computers, a midplane and interposer boards to connect non-volatile memory mass storage devices with the host computers. The host computer may be configured to exchange data and control signals with selected non-volatile memory mass storage devices; the selection of non-volatile memory mass storage devices may be a function of (or performed by) a multiplexing control logic circuit on the interposer boards. The term multiplexing control logic may encompass any logic to make a selection of hosts and/or drives within the computer system.

The interposer boards may have a first e-fuse to gate power to the multiplexing control logic circuit and second e-fuse to gate power to the non-volatile mass storage device. Both the first and the second e-fuse may be logically connected to fault the second e-fuse if a fault condition occurs on the first e-fuse. However, a delay circuit may be utilized to delay the fault of the second e-fuse after the fault of the first e-fuse. The delay circuit may comprise an array of capacitors that are being charged by a midplane voltage and connected to a first MOSFET. In a non-fault condition, the first MOSFET is in a low-resistance state to connect the supply voltage to the capacitors to ground.

The gate of the first MOSFET is connected to a second supply voltage generated by a power converter receiving midplane voltage through the first e-fuse to power the multiplexing control logic circuit. If a fault condition occurs and the first e-fuse cuts power to the power converter, the second supply voltage drains and as soon as the gate threshold voltage of the first MOSFET is undercut, this will switch the first MOSFET to a high resistance state to ground. The high resistance state of the first MOSFET prevents the midplane voltage to the array of capacitors from being drained to ground and causes buildup of a charge of the array of capacitors. When the charge of the capacitors exceeds a gate threshold voltage of a second MOSFET, causing the second MOSFET to switch from a high resistance state to a low resistance state, the low resistance state of the second MOSFET pulls low the ENABLE/FAULT pin of the second e-fuse to turn off power to the non-volatile memory mass storage devices.

A resistor between the midplane voltage and the array of capacitors may limit the inrush current to the capacitors and a second resistor between the array of capacitors and the first MOSFET limits the drain to ground. The method may also utilize a current sense resistor at the second e-fuse to sense an over current condition on the non-volatile memory mass storage device. As discussed above, the midplane voltage in this example is 12V and the power converter generates 3.3V or 1.8V supply voltage for the multiplexing control logic circuit but any other voltage levels may be used.

Computer Systems

FIG. 1A illustrates a side view of a first exemplary computer system, according to an aspect of the present disclosure. In the computer system of FIG. 1A, a host computer 105a may be connected to an array of non-volatile mass storage devices 140, wherein the connection of any drive to the host computer 105a may be managed by an interposer board 130 having a multiplexing control logic circuit 135. The computer system may also include optional sensors as well as over current protection for the multiplexing control logic circuit 135 and the drive. The backbone of the system interconnect maybe a midplane 120, which in most cases is a completely passive printed circuit board with fenestration for airflow and does not contain any active electronic components. Alternatively, depending on the specific system requirements, the midplane 120 may contain active components.

The midplane 120 may receive data and control signals from the host computer 105a and route the data and control signals to a plurality of interposer boards 130, each of the interposer boards in the plurality of interposer boards 130 may be connected to a non-volatile mass storage device or storage drive 140. As described above, the drives can be hard disk drives (HDD) and/or solid state drives (SSD) using protocols like SAS/SATA, NVMe or any other suitable data protocol and where the drives may use rotating magnetic media, NAND flash, ReRAM, MRAM, PCM, FRAM or any other suitable storage media known in the art. In a variation of the design, the control signals may also be generated by a dedicated system control logic on a power interface board 110 (See FIG. 2) serving as a control and sensor relay between the actual server and the rest of the system.

In addition to the gating of power to the individual components such as the host computer and drives as part of the normal operation, i.e. power On/Off, all power paths in the system may be protected by resettable fuses that are configured to trip above a predefined current limit in order to prevent damage to the individual components and the entire system under fault in the case of a fault condition such as a short.

Figure 2:
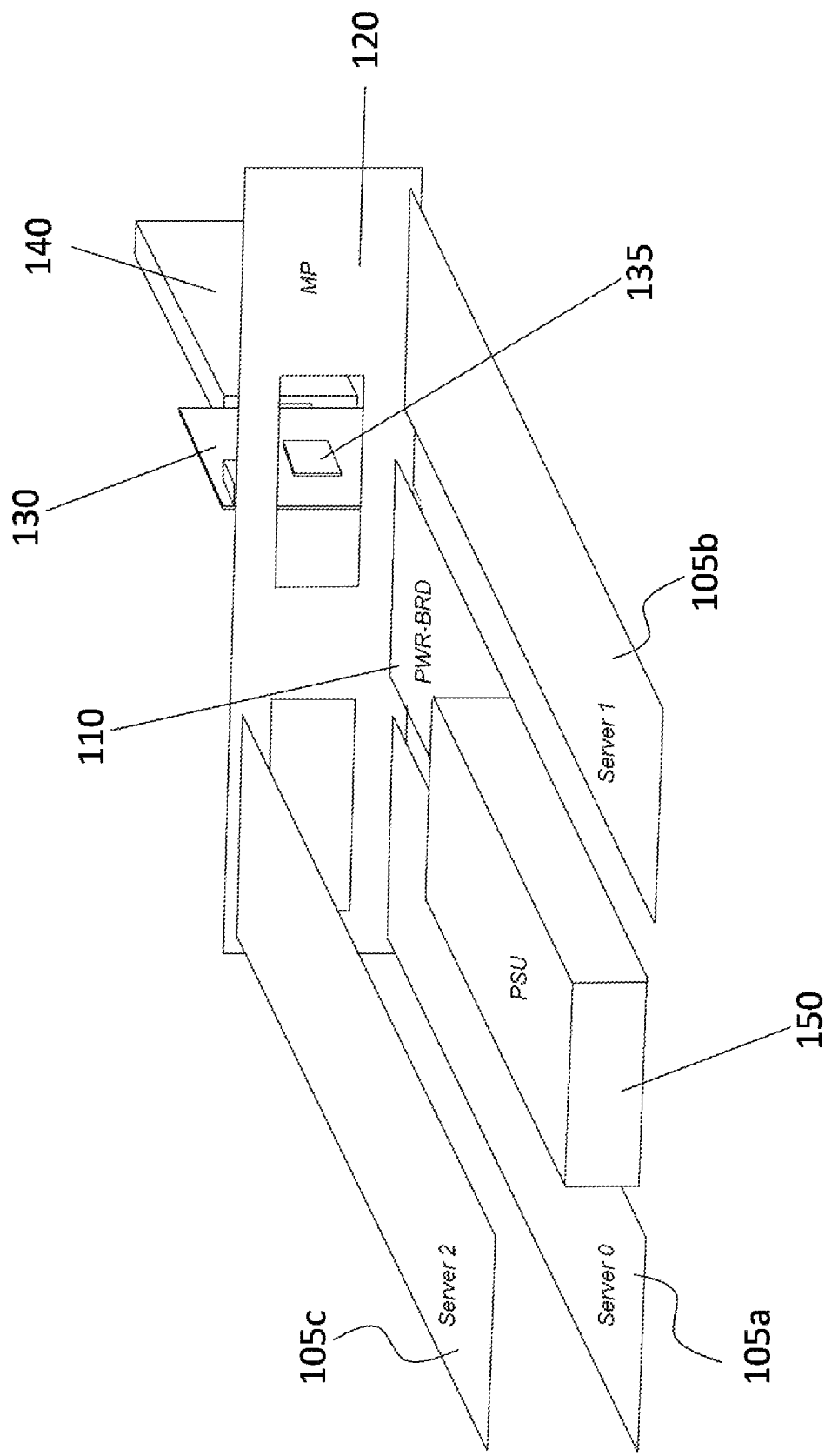
FIG. 2 illustrates an exemplary an isometric overview of the computer systems in FIGS. 1A and/or 1B.

As shown in FIG. 2, power to the system may be routed from a power supply unit 150 to the power interface board 110 and then to the midplane 120 either through cables or bus bars, for example. The midplane 120 may then distribute the power to the host computer 105a and the drive interposer boards 130 through connectors 121, 122. The connectors 121, 122 utilized may be of any type of known in the art capable of distributing power between a host computer and an interposer board. The interposer boards 130 may include the multiplexing control logic circuit 135 for the drive select control and additional control logic for gating the power to the drives, for example an On/Off switch with a remote control.

Figure 1B:
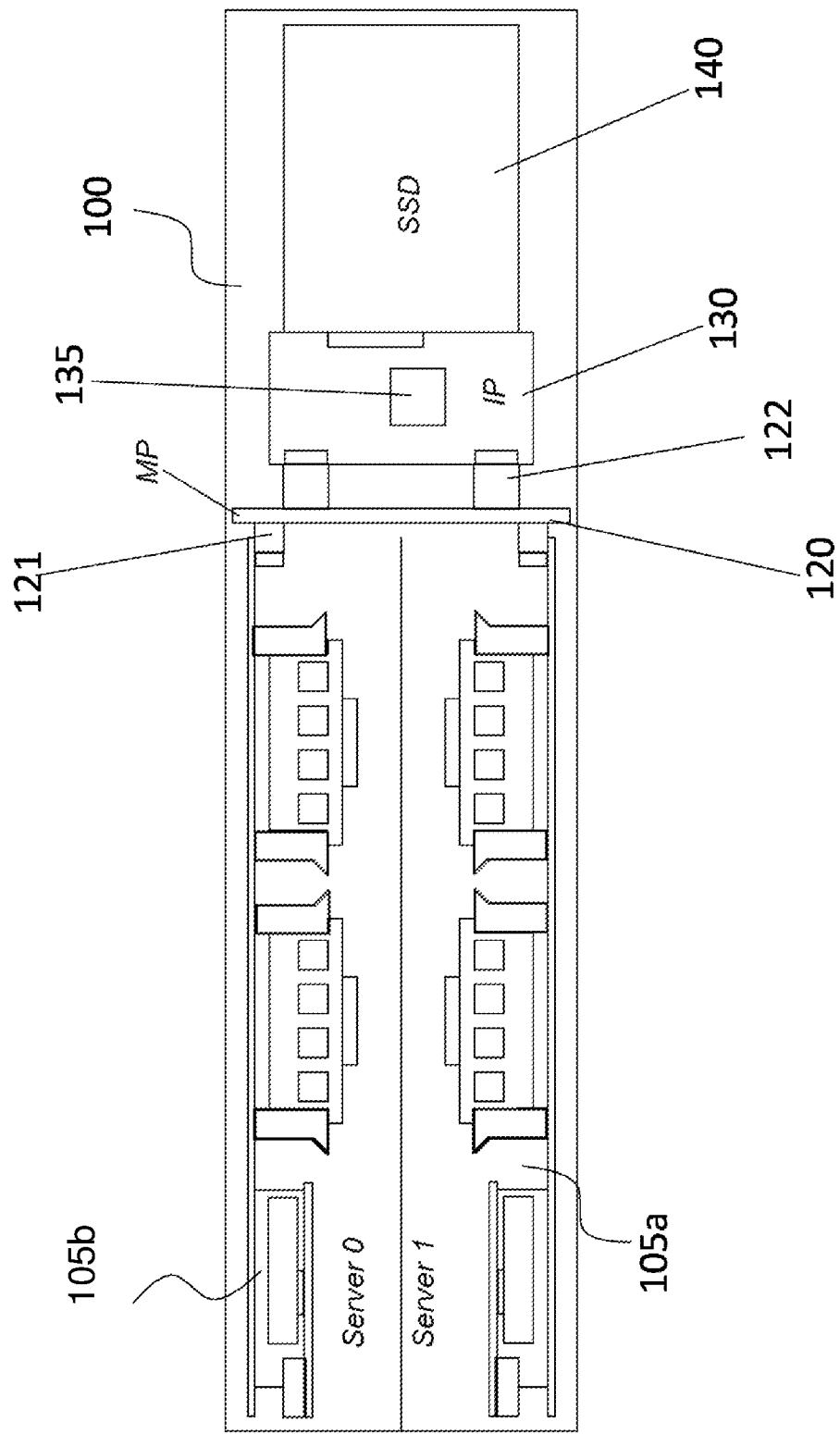
FIG. 1B illustrates a side view of a second exemplary computer system, according to an aspect of the present disclosure.

FIG. 1B illustrates a side view of a second exemplary computer system, according to an aspect of the present disclosure. The computer system in FIG. 1B may include a multi-host multi-drive system 100, a variation of the computer system illustrated in FIG. 1A. The multi-host multi-drive system 100 may include multiple host computers (servers) 105a, 105c connected to an array of non-volatile mass storage devices 140, wherein the allocation of a storage drive to any of the multiple host computers (servers) 105a, 105c may be established by an interposer board 130 having a multiplexing control logic circuit 135. The backbone of the system interconnect of the present disclosure may include a midplane 120, which is typically a completely passive printed circuit board with fenestration for airflow and does not contain any active electronic components. Alternatively, depending on the specific system requirements, the midplane 120 may contain active components.

The midplane 120 may receive data and control signals from the multiple host computers (servers) 105a, 105c and route them to a plurality of interposer boards 130, each of the interposer boards in the plurality of interposer boards 130 may be connected to a non-volatile mass storage device or storage drive 140. The storage drives 140 can be hard disk drives (HDD) and/or solid state drives (SSD) using protocols like SAS/SATA, NVMe or any other suitable data protocol. The storage drives may use rotating magnetic media, NAND flash, resistive random-access memory (ReRAM), magnetoresistive random-access memory (MRAM), phase change material (PCM), ferroelectric random-access memory (FRAM) or any other suitable storage media known in the art. In a variation of the design, the control signals may also be generated by a dedicated system control logic on a power interface board 110 (See FIG. 2) serving as a control and sensor relay between the actual server and the rest of the system.

In addition to the gating of power to the individual components such as the host computers and drives as part of the normal operation, i.e. power On/Off, all power paths in the system may be protected by resettable fuses that are configured to trip above a predefined current limit in order to prevent damage to the individual components and the entire system under fault in the case of a fault condition such as a short.

As shown in FIG. 2, power to the system may be routed from a power supply unit 150 to the power interface board 110 and then to the midplane 120 either through cables or bus bars, for example. The midplane 120 may then distribute the power to the host computers 105a, 105b, 105c and the drive interposer boards 130 through connectors 121, 122. The connectors 121, 122 utilized may be of any type of known in the art capable of distributing power between a host computer and an interposer board. Each of the interposer boards 130 may include the multiplexing control logic circuit 135 for the drive power control and additional control logic for gating the power to the drives.

FIG. 2 illustrates an exemplary an isometric overview of the computer systems in FIGS. 1A and/or 1B with a third server (Server 1) 105b in the same plane as Server 0 105a.

Figure 3A:
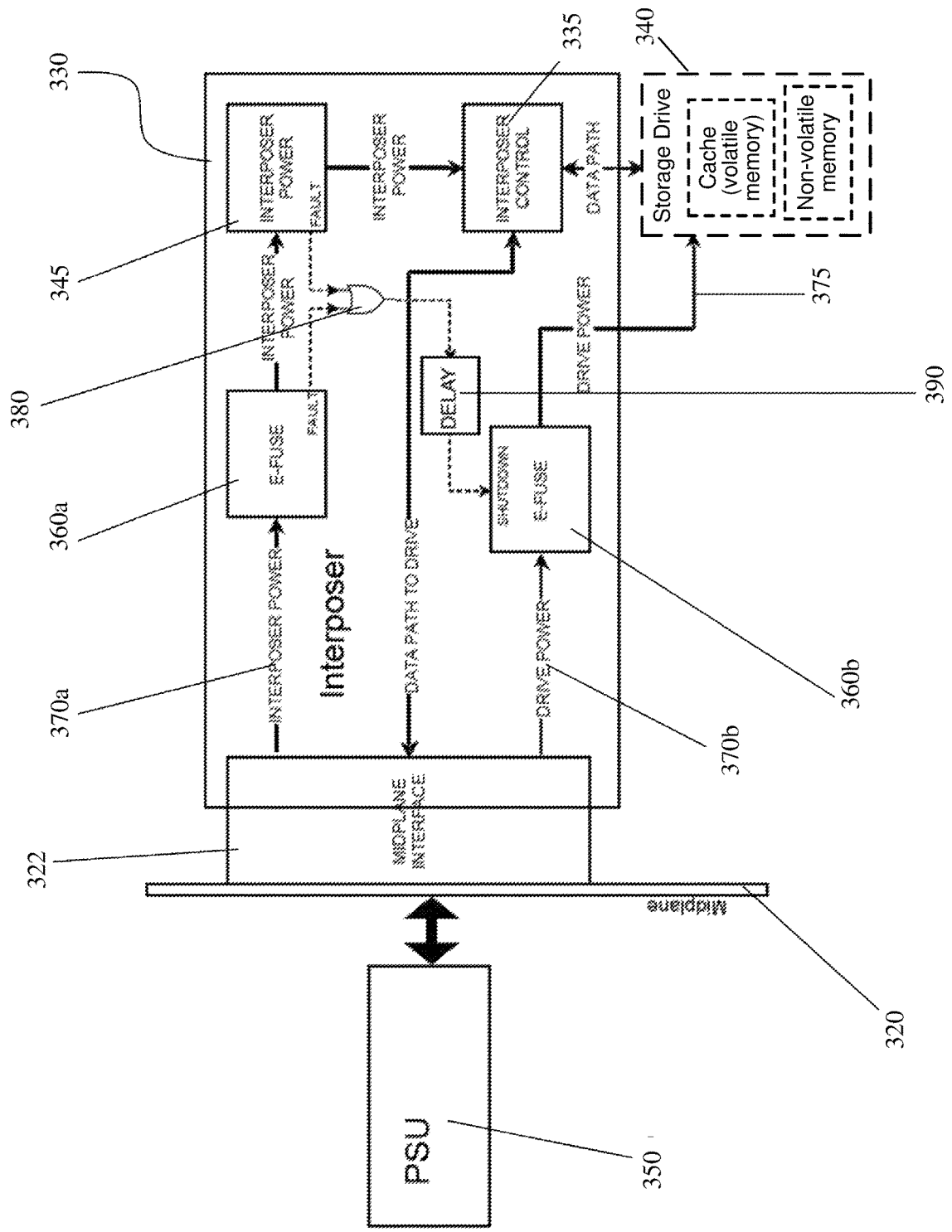
FIG. 3A illustrates an exemplary block diagram of a coupled dual pathway to manage interposer board and drive power, according to an aspect of the present disclosure.

FIG. 3A illustrates an exemplary block diagram of an interposer board 330 having a coupled dual power pathway to manage an interposer board and drive power, according to an aspect of the present disclosure. More specifically, the interposer board 330 has a coupled dual power pathway to supply power from a midplane 320 to both a multiplexing control logic circuit 335 on the interposer board 330 and a the storage drive 340, as described in more detail below.

According to one feature, a circuitry 390 to generate a delay between the cutting of power 370a to a drive interposer 330 and power 370b, 375 to the storage drive 340 attached to the interposer board 330 is provided. The interposer board 330 may include a multiplexing control logic circuit 335 for selecting and controlling the storage drive 340 as well as routing data and in-band and out-of-band control signals to the storage drive 340. The multiplexing control logic circuit 335 may be protected by a first e-fuse 360a against power fault conditions. Additionally, for protection of the storage drive 340 against power fault conditions, a second e-fuse 360b may be integrated into the interposer board 330. In the case of a power fault, the second e-fuse 360b may be configured to trip and cut power to the storage drive 340.

The first and the second e-fuses 360a and 360b may be functionally connected so that if the first e-fuse 360a trips, a fault condition signal is propagated to the second e-fuse 360b, causing the second e-fuse to also trip (i.e., cutting off power to the storage drive 340). In other words, even though power is supplied separately to the multiplexing control logic circuit (i.e. interposer control) 335 and the storage drive 340, any fault condition on the interposer board 330 may interrupt both power rails 370a, 370b while protecting both the storage drive 340 and the interposer control 335 against over-current-induced damage.

In theory, both the interposer board 330 (or multiplexing control logic circuit/interposer control 335 therein) and the storage drive 340 could be protected by a single e-fuse, which cuts power to both the multiplexing control logic circuit/interposer control 335 and the storage drive 340 at the same time. However, the simultaneous cutting of power to the interposer logic (e.g., multiplexing control logic circuit/interposer control 335) and the target device (e.g., storage device 340), that is, the mass storage device attached to the interposer, has two disadvantages. First, it is desirable to power-cycle the storage drive 340 without power-cycling the multiplexing logic in the multiplexing control logic circuit/interposer control 335. Second, there may be data in flight that multiplexing control logic circuit/interposer control 335 are cached on the volatile memory write buffer or cache and may be lost before they are committed/stored to the non-volatile memory data carriers on the storage drive 340. Data of particular relevance may be the metadata that hold the information about virtual to physical memory address translations. Failure to update the metadata table (from cache to the non-volatile memory or storage drive 340) may lead to incorrect pointers to obsolete data or possibly a total corruption of the flash translation layer, thereby rendering the storage drive 340 completely inoperable.

In the case of enterprise-class solid state drives, the risk for this type of corruption may be mitigated by employing on-device energy storage in the form of supercapacitors to provide enough hold-up current to commit all data stored in the volatile memory to the non-volatile data carriers (memory ICs).

Alternatively, system power to the storage drives 340 may be maintained for a brief period of time even after a fault condition has caused the shut-down of the interface. In this case, data traffic to and from the storage drive 340 to the host is interrupted but the power to the drive is maintained, giving the storage drive 340 enough time to purge the data held in the volatile cache into the non-volatile memory data carriers.

In the example illustrated in FIG. 3A, the interposer board (or drive interposer) 330 may be connected to the midplane 320 through a midplane interface 322 which may be any suitable connector or combination of connectors to establish the data and control path and route the power to the drive. The interposer board 330 may receive 12V power through the midplane 320. A first instance of the 12V midplane power 370a is routed to the first e-fuse 360a. Downstream from the first e-fuse 360a are a 3.3V local power converter 345 to generate 3.3V or any other required voltage for the multiplexing control logic circuit/interposer control logic 335.

A second branch of the 12V midplane power 370b may be routed to the second e-fuse 360b that controls the drive power 375 to the storage drive 340. Any fault condition on either the first e-fuse 360a or an interposer power supply 345 may be communicated to the second e-fuse 360b. For illustrative purposes only, the collective communication of any fault condition to the second e-fuse 360b, regardless of where it occurs, is symbolically depicted by an OR-gate 380, but any other suitable way of communicating the fault condition known in the art may be utilized.

The delay circuit 390 may establish a time delay between the shut-down of the first e-fuse 360a controlling the interposer power supply 345 and the second e-fuse 360b controlling the storage drive power. Additionally, the delay circuit 390 may provide a sufficient time delay so that the storage drive 340 has enough time to store data (e.g., metadata) from its volatile cache into its non-volatile memory.

Figure 3B:
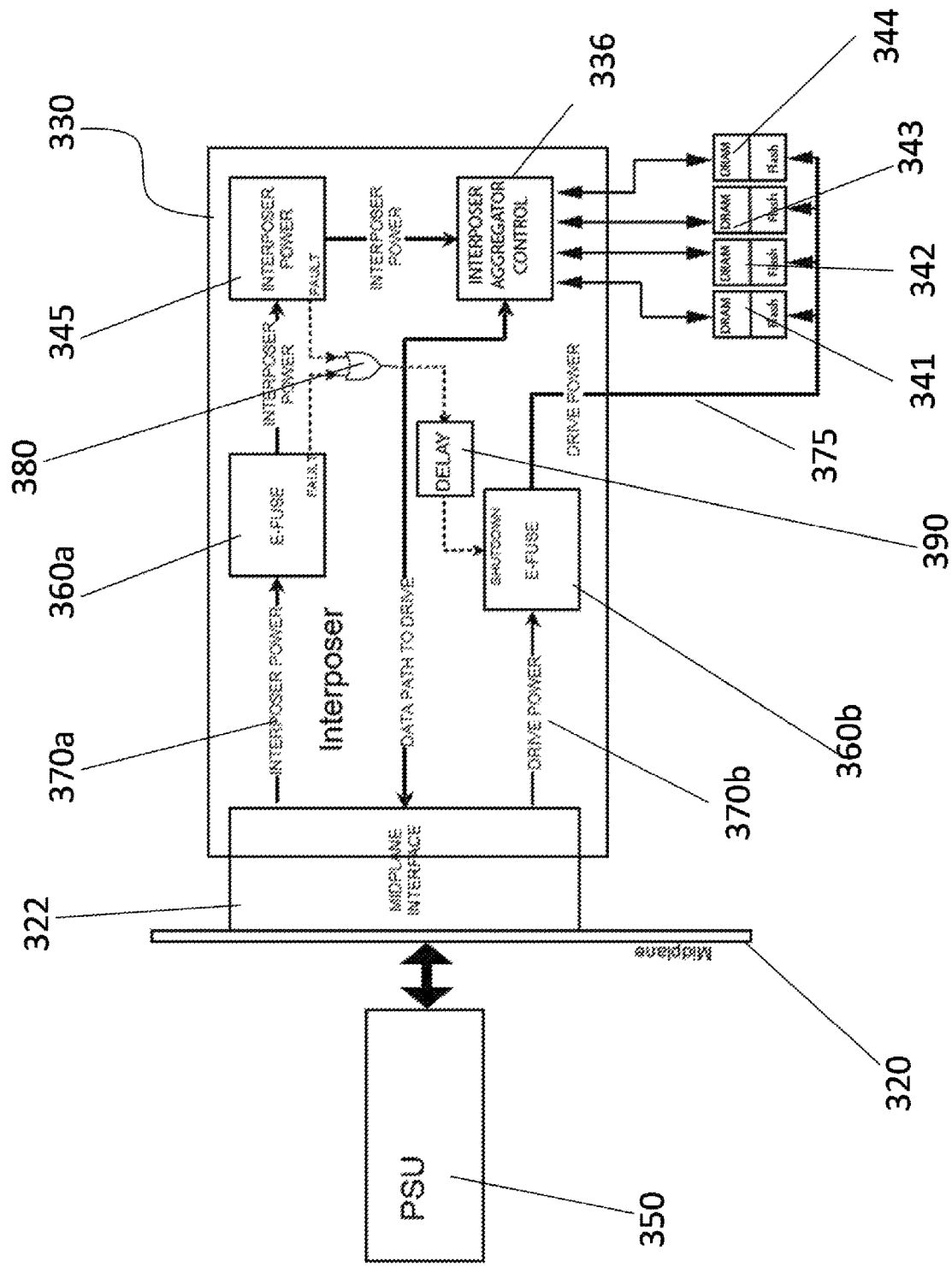
FIG. 3B illustrates another exemplary block diagram of a coupled dual pathway to manage interposer board and drive power, according to an aspect of the present disclosure.

Referring to FIG. 3B, another exemplary block diagram of a coupled dual pathway to manage interposer board and drive power is provided. Power protection of the storage drives may be highly desirable in any design using drive aggregation as it is done for example in any redundant array of independent drives (RAID) or redundant arrays of independent semiconductor elements (RAISE). In short, host writes are distributed across a plurality of drives with or without adding parity information for data protection. Any sudden loss of power to the storage drives may result in some of the data being written to one storage drive but other parts of the data not being written, thereby rendering the written portions of the data incomplete and mismatching any existing parity and/or checksum information. This can become critical if the data have been received by the drive's volatile (DRAM) cache and acknowledged to the host but failed to be committed to the non-volatile storage media because of power loss.

Furthermore, as shown in FIG. 3B, the interposer board may have a switch logic or controller 336 with advanced capabilities, for example, it may function as a fan-out adapter or aggregator for multiple drives 341, 342, 343, 344, including but not limited to enabling RAID or RAISE functionality with separate power protection for the controller and the drives and instantiating the same delay for the drive power shut-off, as described above.

Figure 4:
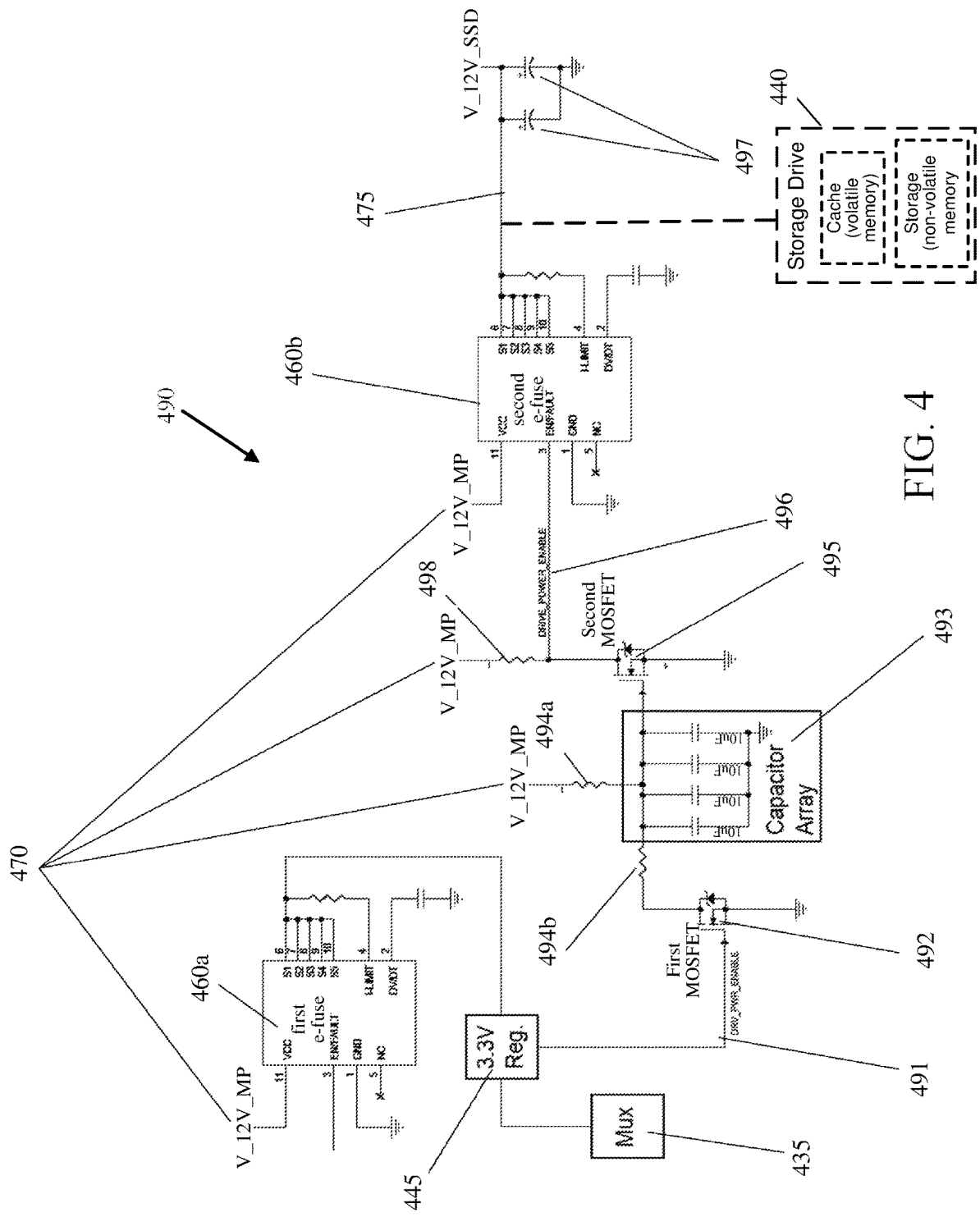
FIG. 4 illustrates an exemplary schematic of a delay circuit, according to an aspect of the present disclosure.

Turning to FIG. 4, an exemplary schematic of the integration of a delay circuit 490 is illustrated. As shown, an interposer may receive 12V power 470 through a power plane connected to the system power supply. The 12V power connection may be any suitable structure including but not limited to a midplane. For ease of understanding and consistency with the drawings, the supply voltage may be referred to as midplane voltage (12_V_MP) but any other power connection to a system supply voltage is possible. The 12V power may be routed to a first e-fuse 460a. Downstream from the first e-fuse 460a are a 3.3V local power converter 445 and an interposer control logic circuit (multiplexing control logic circuit) 435. The 3.3V supply gates a drive power enable (DRV_PWR_ENABLE) signal 491 that controls a first small signal MOSFET 492 to keep the first small signal MOSFET 492 in the On state, that is, in a state of low resistance to ground. In short, the small signal MOSFET 492 acts as a power fault detection circuit. In a non-fault condition the low resistance path to ground prevents charge of an array of capacitors 493 that are powered from the 12V midplane voltage 470. Additional resistors 494a and 494b between the 12V midplane voltage 470, the array of capacitors 493 and the first small signal MOSFET 492 are used to tune the time constants of charge and discharge. The capacitance of the array of capacitors 493 may also factor into the charge and discharge time constants.

The capacitor array 493 may be connected to a second small signal MOSFET 495 providing the gate voltage as control signal to the second small signal MOSFET 495. The second small signal MOSFET 495 may be connected with source and drain to the Enable/Fault pin and ground, respectively, of a second e-fuse 460b which gates the power to the drive (V_12V_SSD). In the Off state of the second MOSFET 495 the DRIVE_POWER_ENABLE signal is pulled high through a pull-up resistor 498 to the midplane voltage 470 and power 475 to the storage drive 440 is turned On. When the first e-fuse 460a trips, the 3.3V converter 445 will no longer receive power and the 3.3V supply drains. As the voltage drops below the gate threshold voltage, the first small signal MOSFET 492 switches to a high resistive state preventing the draining of the capacitor array 493 to ground causing the capacitor array 493 to charge up. Once the charge stored in the capacitor array 493 reaches gate threshold voltage of the second small signal MOSFET 495, this causes the second small signal MOSFET 495 switches On pulling low the control signal for DRIVE_POWER_ENABLE 496 on the second e-fuse 460b controlling the V_12_SSD power 475 to the storage drive 440. This causes the second e-fuse 460b to turn Off drive power 475 to the storage drive 440.

Additional decoupling capacitors 497 may be used on the V_12_SSD drive power 475 output to the storage drive 440.

The resistor values of resistors 494a and 494b, along with the total capacitance of the capacitor array 493, determine the charge and discharge time constant until the gate switching voltage of the second small signal MOSFET 495 is reached, which is the delay time between the turning off power to the interposer switch logic (multiplexing control logic circuit) 435 and the cutting of power 475 to the storage drive 440.

While the present disclosure has been described in form of specific and preferred embodiments and form factors, it is foreseeable that functionally equivalent designs could be used or subsequently developed to perform the intended functions of the disclosed retaining clip. Therefore, it is apparent that other forms could be adopted by one skilled in the art. Finally, while the appended claims recite certain aspects believed to be associated with the invention and investigations discussed above, they do not necessarily serve as limitations to the scope of the present disclosure.

The invention claimed is:

1. A computer device, comprising:
an enclosure having one or more host devices powered by a power supply;
a plurality of non-volatile memory mass storage devices having a volatile memory cache and a non-volatile memory data carrier;
a plurality of interposer boards, the one or more host devices communicatively coupled to the plurality of non-volatile memory mass storage devices by the plurality of interposer boards;
where at least one of the host devices in the one or more host devices is configured to exchange data and control signals with selected non-volatile memory devices in the plurality of non-volatile memory mass storage devices; and
where each of the interposer boards in the plurality of interposer boards comprises:
a first e-fuse to gate power to a logic circuit on the at least one interposer board along a data path to a first non-volatile memory mass storage device in the plurality of non-volatile memory mass storage devices;
a second e-fuse to gate power to the first non-volatile memory mass storage device in the plurality of non-volatile memory mass storage devices, wherein the first and the second e-fuses are logically connected to fault the second e-fuse when a fault condition occurs on the first e-fuse; and
a delay circuit, coupled between the first e-fuse and the second e-fuse, configured to delay the fault of the second e-fuse after the fault of the first e-fuse.

2. The computer device of claim 1, wherein the fault of the second e-fuse causes power to be turned Off to the first non-volatile memory mass storage device after a time delay caused by the delay circuit, the time delay relative to the fault of the first e-fuse.

3. The computer device of claim 2, wherein the time delay provides sufficient time for data to be copied from the volatile cache memory in the first non-volatile memory mass storage device to the non-volatile memory data carrier.

4. The computer device of claim 1, further comprising:
a multiplexing control logic circuit on the interposer boards, the multiplexing logic configured to select a non-volatile mass storage device in the plurality of non-volatile memory devices by the one or more host devices, where a power converter powers the multiplexing control logic circuit.

5. The computer device of claim 4, wherein the delay circuit comprises:
an array of capacitors having one or more capacitors;
a supply voltage adapted to charge the one or more capacitors in the array of capacitors;
a first metal-oxide-semiconductor field-effect transistor (MOSFET) connected to the array of capacitors, wherein when in a non-fault condition, the first MOSFET is in a low-resistance state to connect the supply voltage to the one or more capacitors in the array of capacitors to a ground; and when a fault condition from the power converter powering the multiplexing logic circuit and connected to a gate of the first MOSFET switches the first MOSFET to a high resistance state to ground, the high resistance state of the first MOSFET preventing the supply voltage to the array of capacitors from draining to ground and causing charging of the array of capacitors; and
a second MOSFET coupled to the array of capacitors, wherein when a charge of the one or more capacitors in the array of capacitors exceeds a gate threshold voltage of the second MOSFET, the second MOSFET switches from a high resistance state to a low resistance state, and the low resistance state of the second MOSFET causes the second e-fuse to turn Off power to the first non-volatile memory mass storage device.

6. The computer device of claim 5, further comprising a first resistor coupled between the supply voltage and the array of capacitors for limiting an inrush current; and a second resistor coupled between the array of capacitors and the first MOSFET for limiting a drain of the first MOSFET to ground.

7. The computer device of claim 5, wherein the second e-fuse includes a sense resistor for sensing an over current condition on the first non-volatile memory mass storage device.

8. The computer device of claim 5, wherein the supply voltage is 12 volts.

9. The computer device of claim 5, wherein the power converter provides a voltage of 3.3 volts or 1.8 volts.

10. The computer device of claim 1, wherein the non-volatile memory mass storage devices include non-volatile memory express (NVMe) devices and/or peripheral component interconnect express (PCIe) devices.

11. A circuit, comprising:
a non-volatile memory mass storage device having a volatile memory device and non-volatile memory data carrier, the volatile memory device configured to cache data prior to storing the data on the non-volatile memory data carrier;
a power supply providing power, along a first power path, to a logic circuit along a data path to the storage device, and along a second power path to the storage device;
a power fault detection circuit adapted to remove power from the second power path when a power fault is detected along the first power path; and
a delay circuit configured to delay shutting off the non-volatile memory mass storage device after detection of the power fault along the first power path, the delay circuit providing time for the data to be copied from the volatile memory device to the non-volatile memory data carrier, wherein the delay circuit comprises:
an array of capacitors having one or more capacitors;
a supply voltage adapted to charge the one or more capacitors in the array of capacitors;
a first metal-oxide-semiconductor field-effect transistor (MOSFET) connected to the array of capacitors, wherein when in a non-fault condition, the first MOSFET is in a low-resistance state to connect the supply voltage to the one or more capacitors in the array of capacitors to a ground; and when a fault condition from the power converter powering the multiplexing logic circuit and connected to a gate of the first MOSFET switches the first MOSFET to a high resistance state to ground, the high resistance state of the first MOSFET preventing the supply voltage to the array of capacitors from draining to the ground and causing charging of the array of capacitors; and a second MOSFET coupled to the array of capacitors, wherein when a charge of the one or more capacitors in the array of capacitors exceeds a gate threshold voltage of the second MOSFET, the second MOSFET switches from a high resistance state to a low resistance state, and the low resistance state of the second MOSFET causes the second e-fuse to turn Off power to the non-volatile memory mass storage device.

12. The circuit of claim 11, further comprising a first resistor coupled between the supply voltage and the array of capacitors for limiting an inrush current; and wherein a second resistor coupled between the array of capacitors and the first MOSFET for limiting a drain of the first MOSFET to the ground.

13. A computer device, comprising:
an enclosure having one or more host devices powered by a power supply;
a plurality of non-volatile memory mass storage devices;
a plurality of interposer boards, the one or more host devices communicatively coupled to the plurality of non-volatile memory mass storage devices by the plurality of interposer boards;
a midplane coupled between the one or more host devices and the plurality of interposer boards;
where at least one of the host devices in the one or more host devices is configured to exchange data and control signals with selected non-volatile memory mass storage devices in the plurality of non-volatile memory mass storage devices; and
where each of the interposer boards in the plurality of interposer boards comprises:
a first e-fuse to gate power to a logic circuit on the at least one interposer board along a data path to a first non-volatile memory mass storage device in the plurality of non-volatile memory mass storage devices;
a second e-fuse to gate power to the first non-volatile memory mass storage device in the plurality of non-volatile memory mass storage devices, wherein the first and the second e-fuses are logically connected to fault the second e-fuse when a fault condition occurs on the first e-fuse; and
a delay circuit, coupled between the first e-fuse and the second e-fuse, configured to delay the fault of the second e-fuse after the fault of the first e-fuse; and
where the midplane receives the data and the control signals from the one or more host devices and routes the data and the control signals to the plurality of interposer boards.

14. The computer device of claim 13, wherein the delay circuit comprises:
an array of capacitors having one or more capacitors;
a midplane supply voltage source adapted to charge the one or more capacitors in the array of capacitors;
a first metal-oxide-semiconductor field-effect transistor (MOSFET) connected to the array of capacitors, wherein in a non-fault condition, the first MOSFET is in a low-resistance state to connect the midplane supply voltage source to the one or more capacitors in the array of capacitors to a ground and wherein a fault condition from the power converter powering the multiplexing logic circuit and connected to a gate of the first MOSFET switches the first MOSFET to a high resistance state to ground, the high resistance state of the first MOSFET prevents the supply voltage to the array of capacitors from draining to the ground and causing charging of the array of capacitors; and
a second MOSFET coupled to the array of capacitors, when a charge of the one or more capacitors in the array of capacitors exceeds a gate threshold voltage of the second MOSFET the second MOSFET switches from a high resistance state to a low resistance state, and the low resistance state of the second MOSFET causes the second e-fuse to turn Off power to the plurality of non-volatile memory mass storage device.

15. The computer device of claim 14, further comprising a first resistor coupled between the midplane supply voltage and the array of capacitors for limiting an inrush current; and a second resistor coupled between the array of capacitors and the first MOSFET for limiting a drain of the first MOSFET to the ground.

16. The computer device of claim 14, wherein the second e-fuse includes a sense resistor for sensing an over current condition on the first non-volatile memory mass storage device.

* * * * *